(12) United States Patent
Chen

(10) Patent No.: US 9,198,323 B1
(45) Date of Patent: Nov. 24, 2015

(54) THIN SERVER RACK RAIL

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

( * ) Notice: Subject to any disclaimer, the term of this patent is extended or adjusted under 35 U.S.C. 154(b) by 0 days.

(21) Appl. No.: 14/478,288

(22) Filed: Sep. 5, 2014

(51) Int. Cl.
*H05K 7/14* (2006.01)
*F16C 29/10* (2006.01)
*F16C 29/04* (2006.01)

(52) U.S. Cl.
CPC ............. *H05K 7/1489* (2013.01); *F16C 29/04* (2013.01); *F16C 29/10* (2013.01)

(58) Field of Classification Search
CPC ................................ A47B 88/10; A47B 88/16
USPC .................................. 312/333, 319.1; 384/21
See application file for complete search history.

(56) References Cited

U.S. PATENT DOCUMENTS

| | | | | |
|---|---|---|---|---|
| 5,961,193 A * | 10/1999 | Hobbs | ..................... | A47B 88/10 312/333 |
| 6,685,288 B1 * | 2/2004 | MacMillan | ............ | A47B 88/10 312/334.44 |
| 2005/0017614 A1 * | 1/2005 | Cirocco | ................. | A47B 88/08 312/333 |
| 2009/0096340 A1 * | 4/2009 | Chen | ...................... | A47B 88/16 312/334.46 |
| 2012/0027325 A1 * | 2/2012 | Lacarra | ................... | A47B 88/10 384/18 |
| 2012/0043872 A1 * | 2/2012 | Enos | ...................... | A47B 88/10 312/332.1 |
| 2012/0097689 A1 * | 4/2012 | Grainger | ................ | A47B 88/10 220/694 |
| 2013/0016928 A1 * | 1/2013 | Chen | ...................... | A47B 88/10 384/35 |
| 2013/0039608 A1 * | 2/2013 | Chen | ...................... | A47B 88/10 384/20 |
| 2013/0259411 A1 * | 10/2013 | Judge | ...................... | F16C 29/04 384/49 |
| 2013/0328470 A1 * | 12/2013 | Yoshizumi | ............. | A47B 88/16 312/334.47 |
| 2013/0334766 A1 * | 12/2013 | Okamoto | ........... | A47B 88/0466 271/145 |

* cited by examiner

*Primary Examiner* — Hanh V Tran
(74) *Attorney, Agent, or Firm* — Rosenberg, Klein & Lee

(57) ABSTRACT

A thin server rack rail includes an outer rail, at least one first rolling ball board, a middle rail, at least one second rolling ball board, an inner rail and a fixing assembly. The outer rail includes a passage formed by a pair of limit members. The first and second rolling ball boards are provided for moving the outer, middle and inner rails with respect to one another to achieve the effect of extending or shortening the length in three stages. The middle rail has a swinging plate installed corresponsive to the passage. The inner rail has a containing space for guiding the swinging plate, so that the inner and middle rails may perform a limit movement. The inner rail includes a link rod assembly corresponsive to a bump and provided for the purpose of connection and detachment, so as to improve the convenience of installation and application.

8 Claims, 7 Drawing Sheets

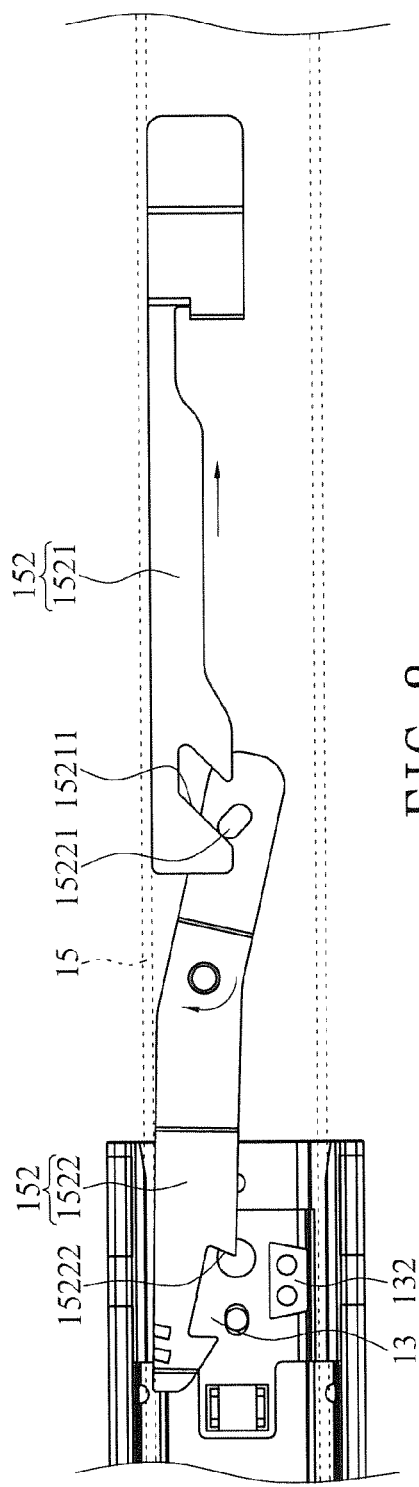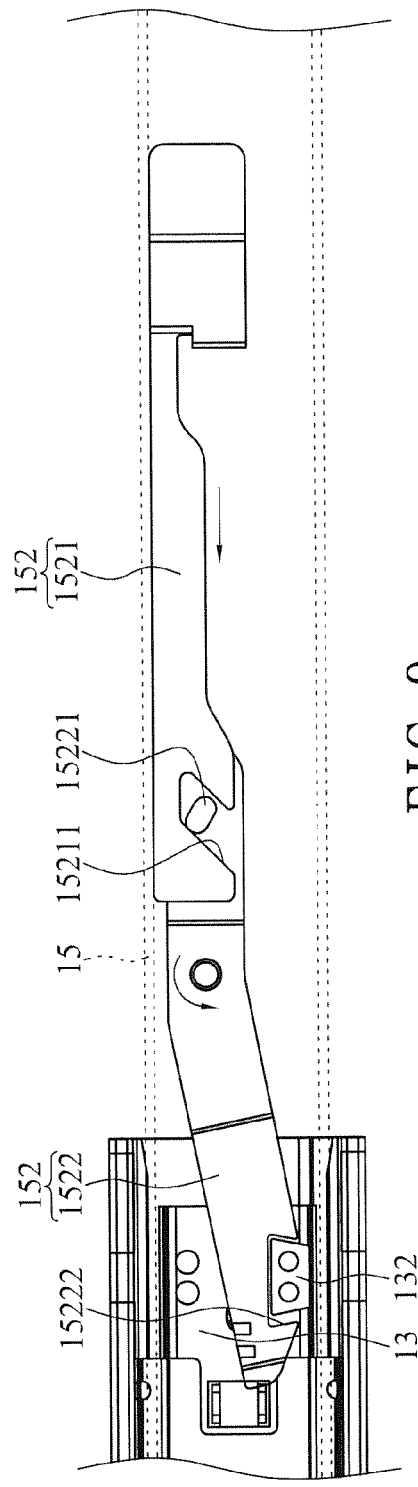

THIN SERVER RACK RAIL

BACKGROUND OF THE INVENTION

1. Field of the Invention

The present invention relates to the field of slides, and more particularly to a thin server rack rail applied in a server rack.

2. Description of the Related Art

In general, industrial chasses are divided according to thickness into 1U, 2U and 3U sizes and installed horizontally and sequentially into a server rack, so that the industrial chasses are stored into server rack in a stacked form. If the server rack includes a plurality of frames vertically installed therein, and a plurality of installing holes or screw holes formed on opposite sides of each frame, a fixing member or a fixing screw may be used to mount the industrial chasses between the frames.

However, different server racks may come with the frames having the fixing holes or screw holes formed at different positions, so that it is necessary to choose appropriate fixing members and screws for the installation. In addition, the disassembling process required for maintenance and repair also causes inconvenience to users. In recent years, some manufacturers install a slide between a server rack and an industrial computer to overcome the aforementioned problems, and provide the features of stretching, overlapping and retracting the slide for pulling the industrial computer out from the server rack for use, pushing the industrial computer into the server rack for storage, or removing the industrial computer from the server rack for expansion, swap or maintenance.

At present, most of the rails of the industrial computer have a 3-stage structural design, and the structure comprises an outer rail, at least one first rolling ball board, a middle rail, at least one second rolling ball board, and an inner rail, wherein both opposite ends of the outer rail and the inner rail have a fixing base for installing into the installing holes or screw holes. For different functional requirements, manufacturers develop the slides with various designs. To prevent the slides from being pulled out too much and falling out during use, most slides have a captive design and thus the structure of the slides becomes complicated, and the volume of the components also increases. Therefore, related manufacturers spare no effort to reduce the thickness effectively while maintaining the original function in order to improve the drawbacks of the conventional slides.

SUMMARY OF THE INVENTION

In view of the aforementioned problems of the prior art, it is a primary objective of the present invention to provide a thin server rack rail with a thin captive design, not only achieving the effect of convenient installation and operation, but also providing the effects of adjusting the length and installing/removing the front end of the rail to/from the fixing assembly to provide more convenient installation and operation. In addition, the present invention further comprises a locking structure for locking and securing the inner rail and the industrial computer to simplify the assembling procedure and enhancing the stability of the installed rail.

To achieve the aforementioned objective, the present invention provides a thin server rack rail installed on two outer sides of an industrial chassis for combining into the server rack for use, and the thin server rack rail comprises: an outer rail, having a pair of limit members installed at a position on a surface of a middle section of the outer rail, and symmetrically installed with an interval apart from each other to form a passage; at least one first rolling ball board, movably installed in the outer rail, such that the first rolling ball board may perform a limit movement in the outer rail; a middle rail, movably installed in the first rolling ball board, for performing a limit movement with respect to the outer rail, and having a swinging plate pivotally installed at a surface of an end of the middle rail, and the other end of the swinging plate having a first pillar configure to be corresponsive to the passage, and the middle rail having a bump disposed on a surface at the front of the middle rail; at least one second rolling ball board, movably installed in the middle rail, such that the second rolling ball board may perform a limit movement in the middle rail; an inner rail, movably installed in the second rolling ball board, and the inner rail having a containing space formed therein and corresponsive to the swinging plate, and the containing space being provide for guiding the position of the swinging plate, so that the inner rail may perform a limit movement with respect to the middle rail by using the second rolling ball board, and when the inner rail is moved outwardly, the middle rail is linked to move outwardly together with the inner rail, and after the swinging plate is latched by one of the limit members, the middle rail will not continue to move outwardly, and the inner rail includes a link rod assembly corresponsive to the bump, and the link rod assembly is selectively latched to the bump for connection and use and separated from the bump to remove the inner rail; and a fixing assembly, covered and installed on the exterior of the outer rail, and having a length greater than that of the outer rail, and both ends of the fixing assembly having a fixing base passed and fixed into two symmetrical installing holes of the server rack separately.

In an embodiment, the swinging plate is substantially a triangular plate structure, and the first pillar is installed at an end of the swinging plate, and the other side of the swinging plate opposite to the first pillar has a pivoting portion, and a surface of the middle rail corresponsive to the first pillar has a limit slot, so that the first pillar may be movably installed in the limit slot. The link rod assembly comprises a first link rod and a second link rod, and the first link rod is parallel to the inner rail and movably installed into a surface of the inner rail, and the second link rod is pivotally coupled to a surface of the inner rail, and an end of the first link rod has a first notch, and an end of the second link rod includes a second pillar corresponsive to the first notch, so that the second pillar is received in the first notch, and the other end of the second link rod includes a second notch for latching the bump.

The fixing assembly is formed by engaging a first casing with a second casing integrally, and the first casing and the second casing may slide with respect to each other to extend or shorten the length. The fixing base includes a bump formed at the front of the fixing base and with a shape corresponsive to the installing hole, and the bump includes a latch member movably installed therein, and the latch member is protruded downwardly from a surface of the bump by gravity and latched into the installing hole. The latch member includes a bevel corresponsive to a plugging direction, so that the latch member can be plugged into the installing hole easily.

In another embodiment of the present invention, the thin server rack rail further comprises a locking structure, and the locking structure comprises a locking element, a locking hole, a locking plate and a handle, and the locking element is disposed on a surface of the industrial chassis, and the locking hole is formed at a position of the inner rail and corresponsive to the locking element, and the locking plate is installed on a surface of the inner rail on a side of the locking hole, and the handle is pivotally coupled to a side of the locking plate, and the handle is rotated and then plugged between the locking plate and the inner rail, such that the locking element is latched into the locking plate to define a locking status. The locking hole is configured to be corresponsive to the locking element to form an 8-shaped latch hole provided for being latched by a tapered portion of the locking element, and the locking plate includes at least one guide plate warped with respect to the handle and provided for inserting the handle between the locking plate and the inner rail.

BRIEF DESCRIPTION OF THE DRAWINGS

FIG. 8 is a first schematic view of the status of installing a fixing base of a preferred embodiment of the present invention;

FIG. 9 is a second schematic view of the status of installing a fixing base of a preferred embodiment of the present invention;

DETAILED DESCRIPTION OF THE PREFERRED EMBODIMENTS

The aforementioned and other objectives, technical characteristics and advantages of the present invention will become apparent with the detailed description of preferred embodiments and the illustration of related drawings as follows.

Figure 1:
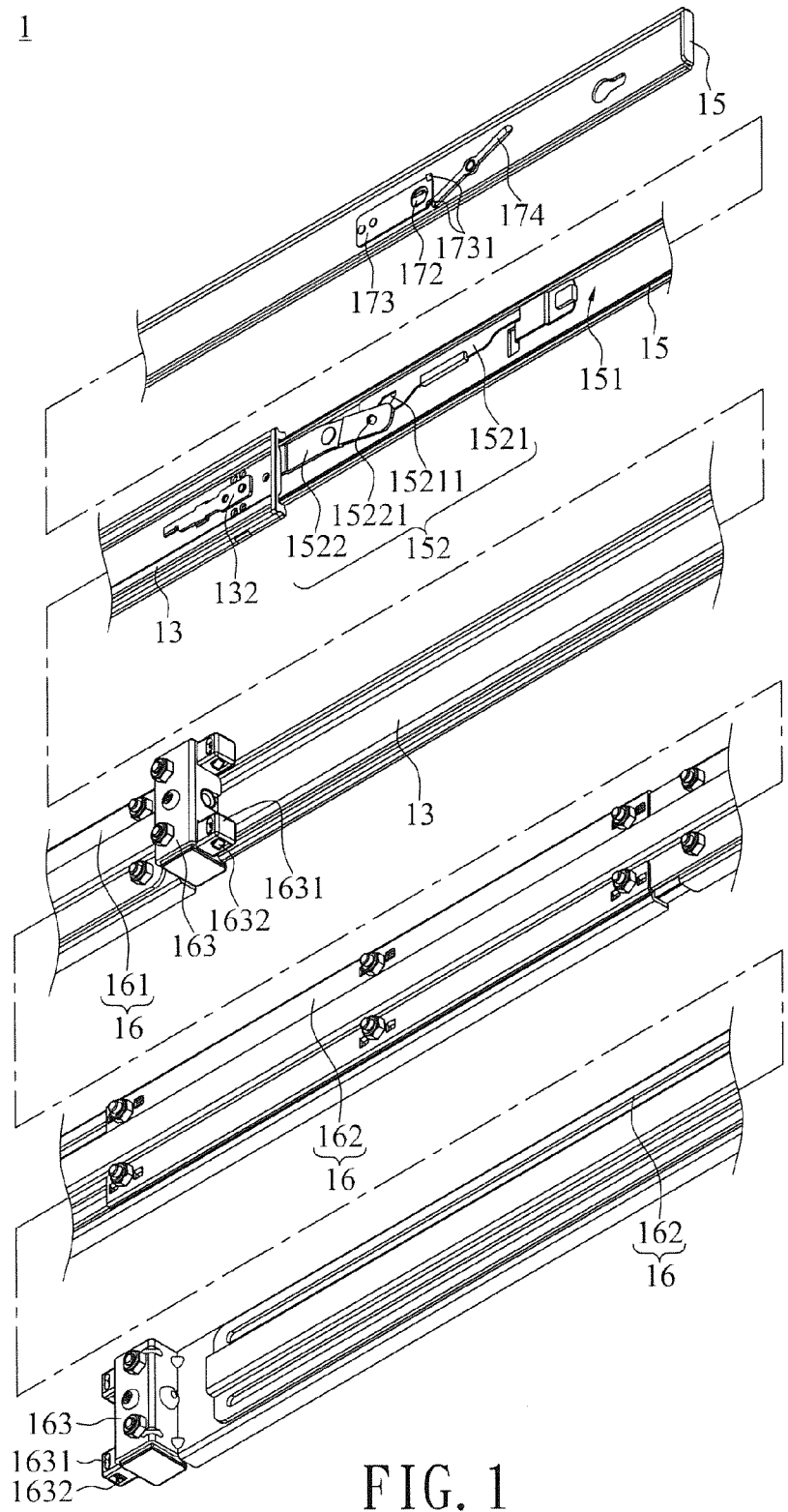
FIG. 1 is a schematic view of a thin server rack rail of a preferred embodiment of the present invention viewing from a first viewing angle.
Figure 2:
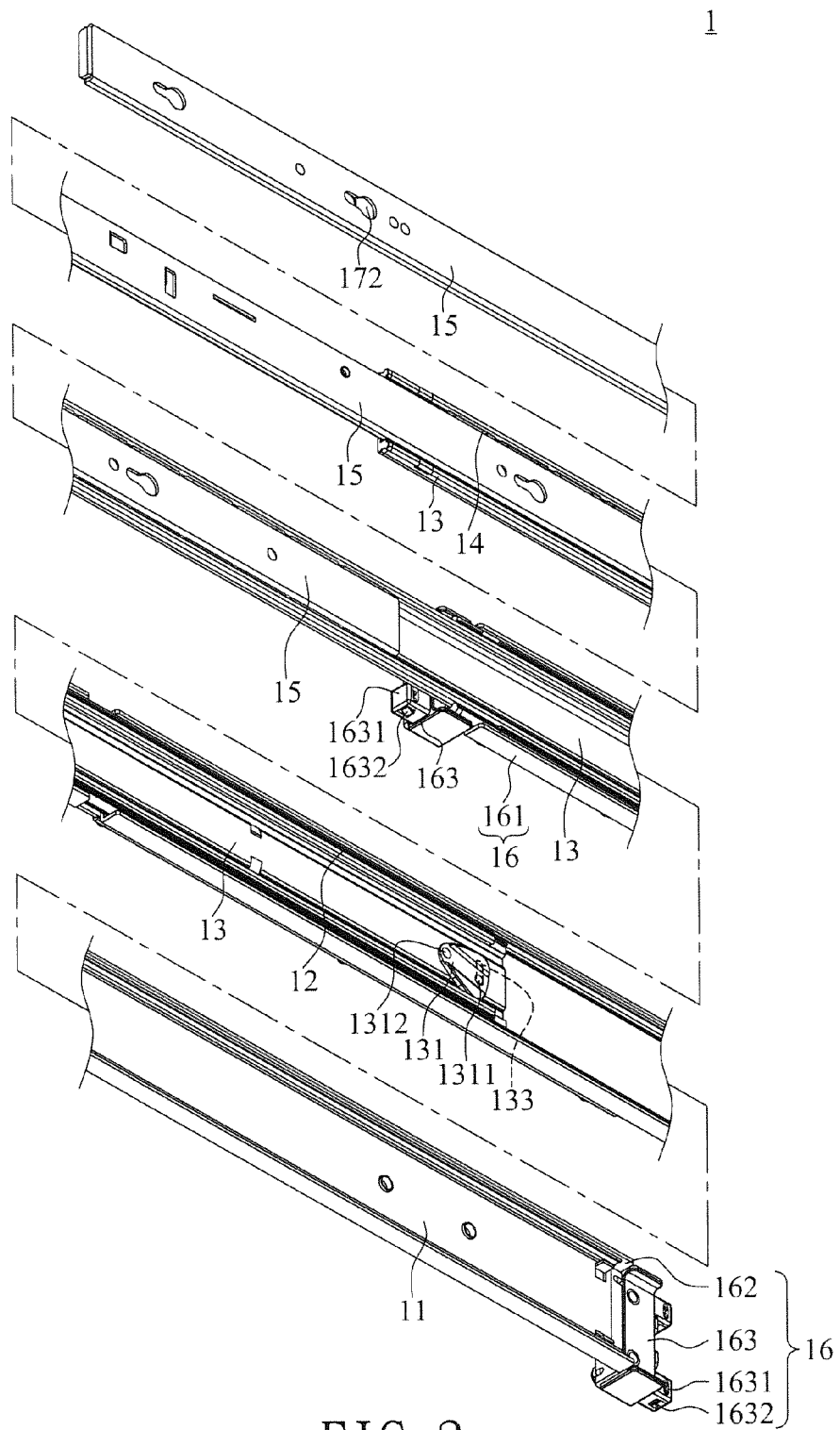
FIG. 2 is a schematic view of a thin server rack rail of a preferred embodiment of the present invention viewing from a second viewing angle.
Figure 3:
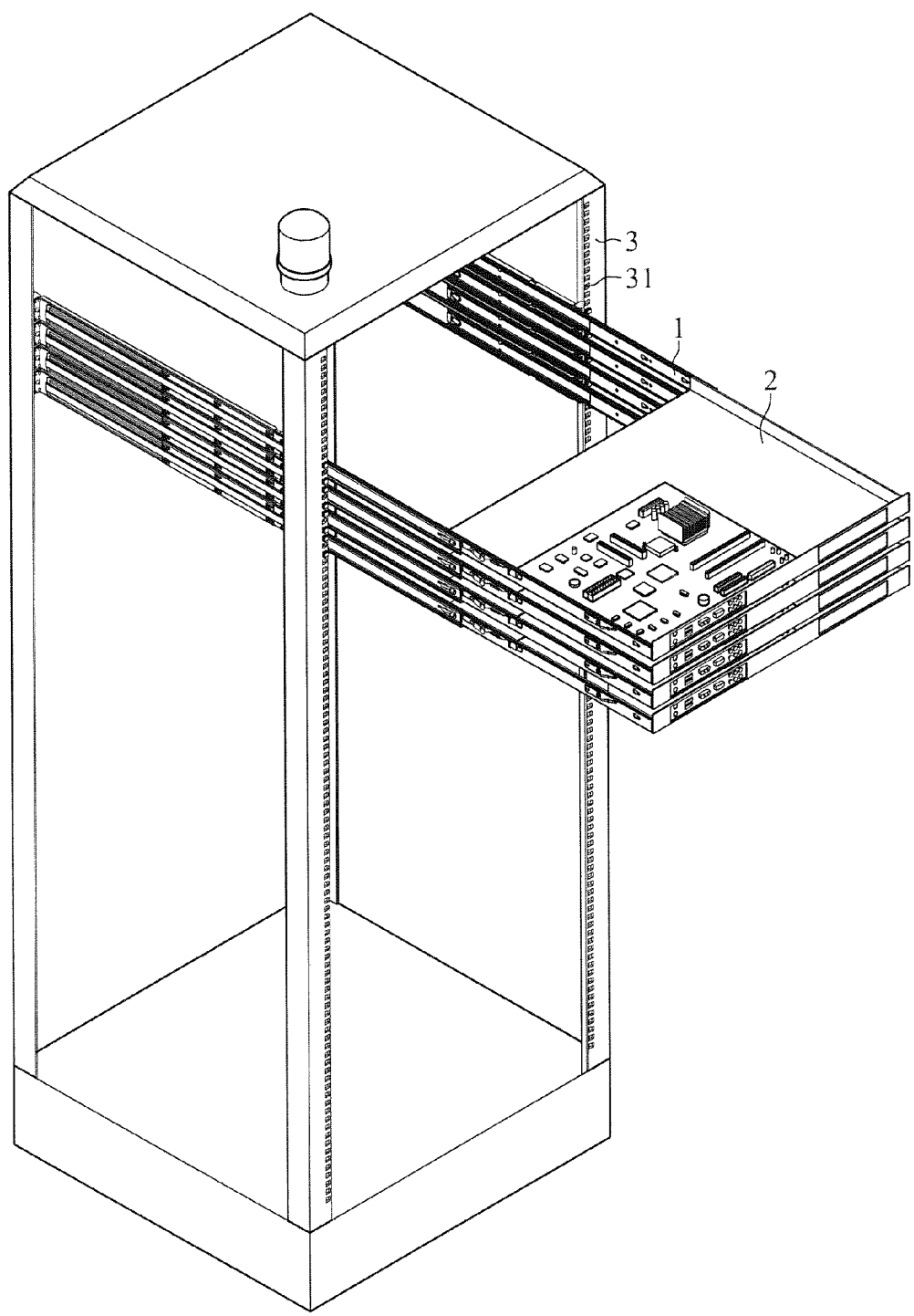
FIG. 3 is a schematic view of the status of an installed thin server rack rail of a preferred embodiment of the present invention.

With reference to FIGS. 1, 2 and 3 for schematic views of a thin server rack rail viewing from different viewing angles and a schematic view of the installed server rack rail of a preferred embodiment of the present invention respectively, the thin server rack rail 1 comprises an outer rail 11, a pair of first rolling ball boards 12, a middle rail 13, a pair of second rolling ball boards 14, an inner rail 15 and a fixing assembly 16 for installing on two outer sides of an industrial chassis 2 and combining with the interior of the server rack 3 for use.

Wherein, the outer rail 11 is formed by stamping a sheet metal into an elongated structure with an n-shaped cross-section, and installing a pair of limit members 111 at appropriate positions on an inner side of the middle section of the outer rail 11, and the pair of limit members 111 are disposed symmetrically with an interval apart to form a passage 112, and the pair of limit members 111 is stamped to form a triangular block structure with a side coupled to the outer rail 11 and the other end warped to form a bevel with a tilted direction corresponsive to the outwardly sliding direction of the middle rail 13.

The pair of first rolling ball boards 12 are movably installed in the outer rail 11, so that the pair of first rolling ball boards 12 may perform a limit movement in the outer rail 11.

Figure 4:
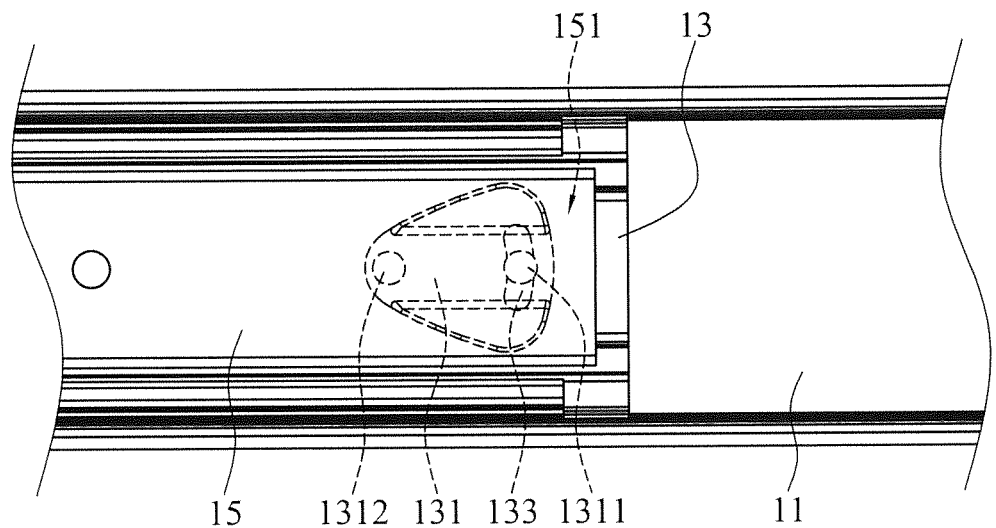
FIG. 4 is a first schematic view of the status of telescoping a thin server rack rail of a preferred embodiment of the present invention.
Figure 5:
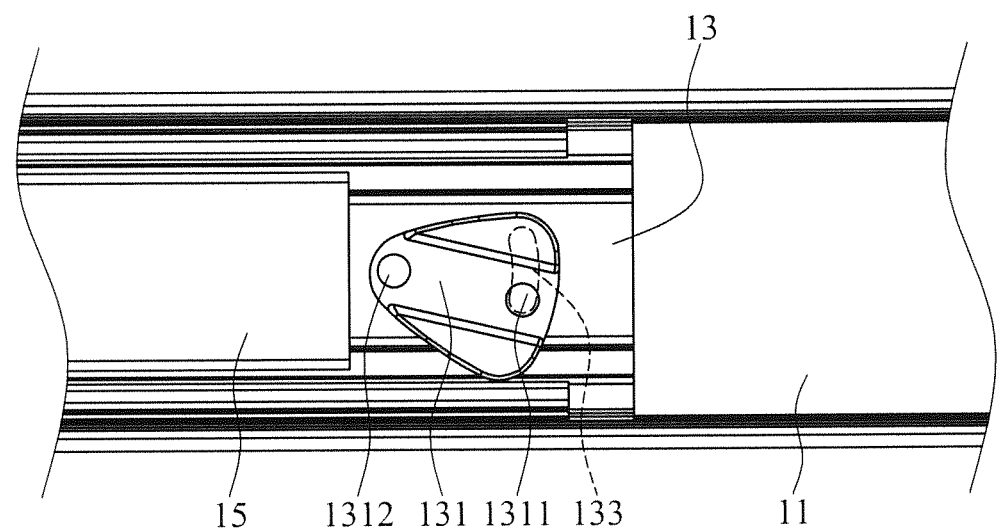
FIG. 5 is a second schematic view of the status of telescoping a thin server rack rail of a preferred embodiment of the present invention.

With reference to FIGS. 4 and 5 for schematic views of the status of telescoping a thin server rack rail of a preferred embodiment of the present invention, the middle rail 13 is formed by stamping a metal sheet into an elongated structure with an n-shaped cross-section and movably installed in the pair of first rolling ball boards 12, so that the middle rail 13 can perform a limit movement with respect to the outer rail 11. The middle rail 13 includes a swinging plate 131 pivotally coupled to a surface at an appropriate position of an end of the middle rail 13, and the other end of the swinging plate 131 includes a first pillar 1311 corresponsive to the passage 112, and a bump 132 disposed on a surface of the front of the middle rail 13. It is noteworthy that the swinging plate 131 is substantially a triangular plate structure, and the first pillar 1311 is installed at an end of the swinging plate 131, and the swinging plate 131 has a pivoting portion 1312 disposed opposite to the other side of the first pillar 1311, and the surface of the middle rail 13 has a limit slot 133 corresponsive to the first pillar 1311, so that the first pillar 1311 is movably installed in the limit slot 133.

The pair of second rolling ball boards 14 are movably installed in the middle rail 13, so that the pair of second rolling ball boards can perform a limit movement in the middle rail 13.

Figure 6:
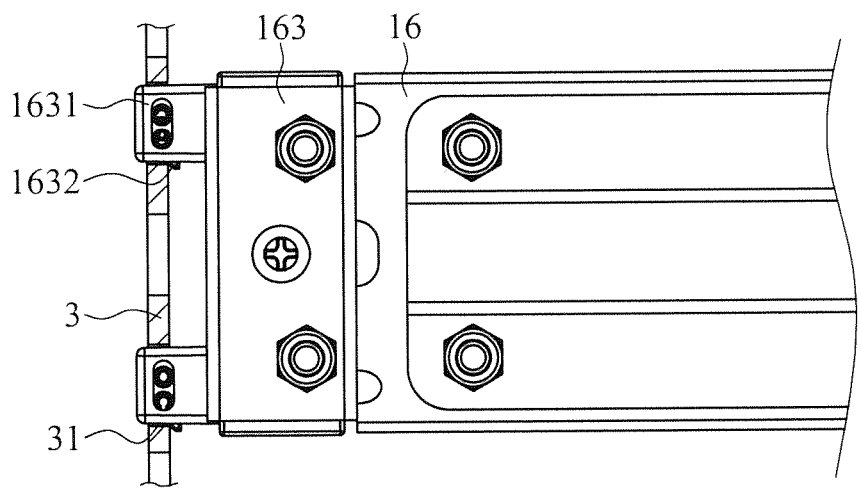
FIG. 6 is a first schematic view of the status of releasing a thin server rack rail of a preferred embodiment of the present invention.
Figure 7:
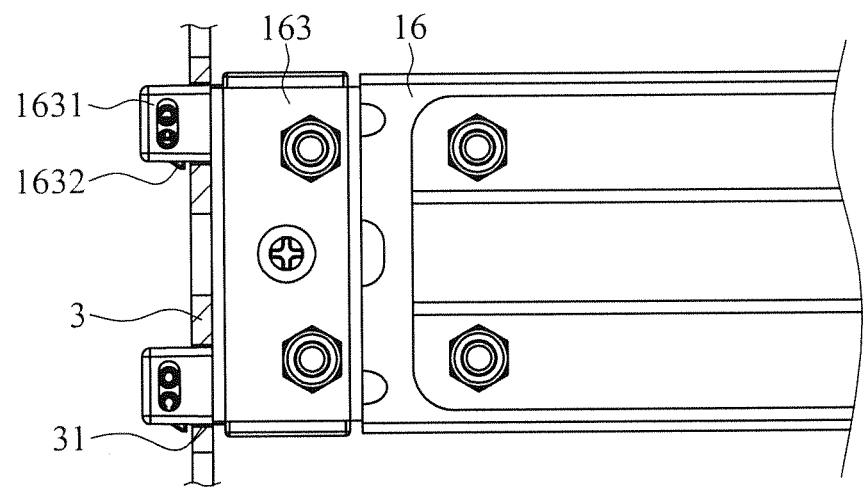
FIG. 7 is a second schematic view of the status of releasing a thin server rack rail of a preferred embodiment of the present invention.

The inner rail 15 is also made by stamping a metal sheet to form an elongated structure with an n-shaped cross-section, and the inner rail 15 has a thickness approximately equal to 3.8 mm, and it is movably installed in the pair of second rolling ball boards 14, and the inner rail 15 has a containing space 151 with a interior corresponsive to the swinging plate 131, and the containing space 151 is provided for guiding the position of the swinging plate 131, so that the inner rail 15 can use the second rolling ball board 14 to perform a limit movement with respect to the middle rail 13. When the inner rail 15 is moved outwardly, the middle rail 13 is linked to move outwardly altogether. After the swinging plate 131 is latched by one of the limit members 111, the middle rail 13 will not continue to move outwardly. In addition, the inner rail 15 includes a link rod assembly 152 corresponsive to the bump 132, and the link rod assembly 152 is latched to the bump 132 for connection and use, or separated from the bump 132 to remove the inner rail 15. With reference to FIGS. 6 and 7 for schematic views of the status of releasing a thin server rack rail of a preferred embodiment of the present invention, the link rod assembly 152 comprises a first link rod 1521 and a second link rod 1522, and the first link rod 1521 is parallel to the inner rail 15 and movably installed on the surface of the inner rail 15, and the second link rod 1521 is pivotally coupled to a surface of the inner rail 15, and a first notch 15211 is formed at an end of the first link rod 1521, and an end of the second link rod 1522 corresponsive to the first notch 15211 has a second pillar 15221, so that the second pillar 15221 is contained in the first notch 15211, and a second notch 15222 is formed at the other end of the second link rod 1522 for latching the bump 132. If the first link rod 1521 is pushed horizontally to move inwardly, the second link rod 1522 will be rotated downwardly, so that the second link rod 1522 is separated from the bump 132 to define a separated status. On the other hand, if the bump 132 falls into the second notch 15222 again, the middle rail 13 and the inner rail 15 are connected to define a connected status.

The fixing assembly 16 is formed by engaging a first casing 161 and a second casing 162 integrally and provided for covering onto the outer rail 11, and the fixing assembly 16 has a length greater than the length of the outer rail 11, and both ends of the fixing assembly 16 have a fixing base 163 for passing and fixing into the two symmetrical installing holes 31 of the server rack 3. It is noteworthy that the first casing 161 and the second casing 162 of the present invention may slide with respect to each other to achieve the function of extending or shortening the length to fit different sized server racks 3. With reference to FIGS. 8 and 9 for schematic views of the status of installing a fixing base of a preferred embodiment of the present invention, a bump 1631 corresponsive to the shape of the installing hole 31 is formed at the front end of the fixing base 163, and the bump 1631 includes a latch member 1632 movably installed therein, and the latch member 1632 is protruded outwardly from the surface by gravity and latched into the installing hole 31, and the latch member 1632 includes a bevel 16321 disposed in a direction corresponsive to the plugging direction.

Figure 10:
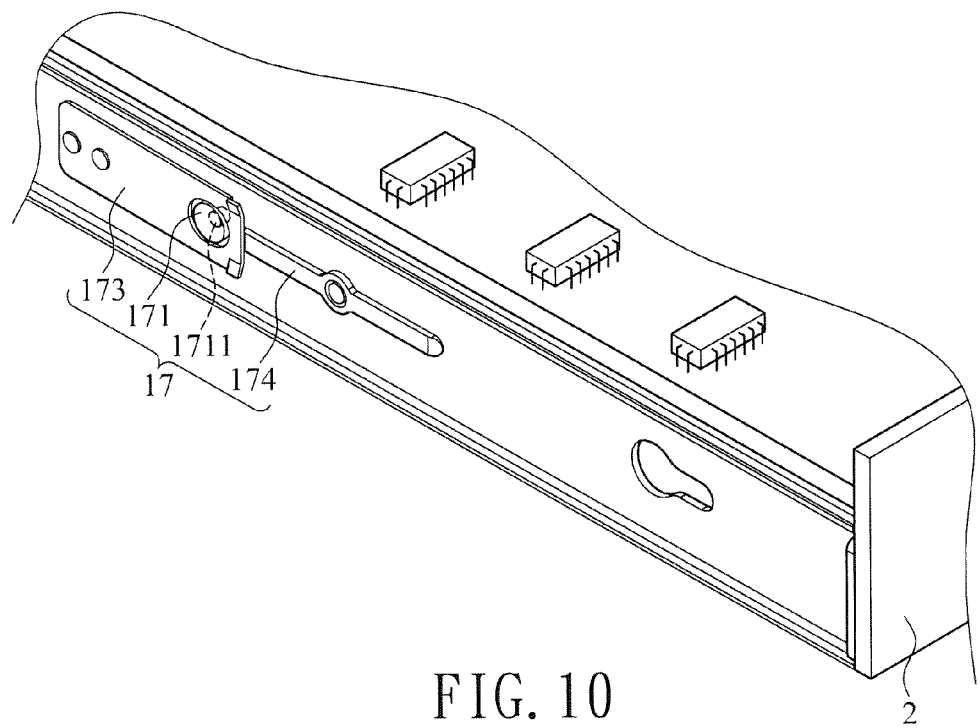
FIG. 10 is a first schematic view of the status of combining an inner rail with an industrial chassis of a preferred embodiment of the present invention.
Figure 11:
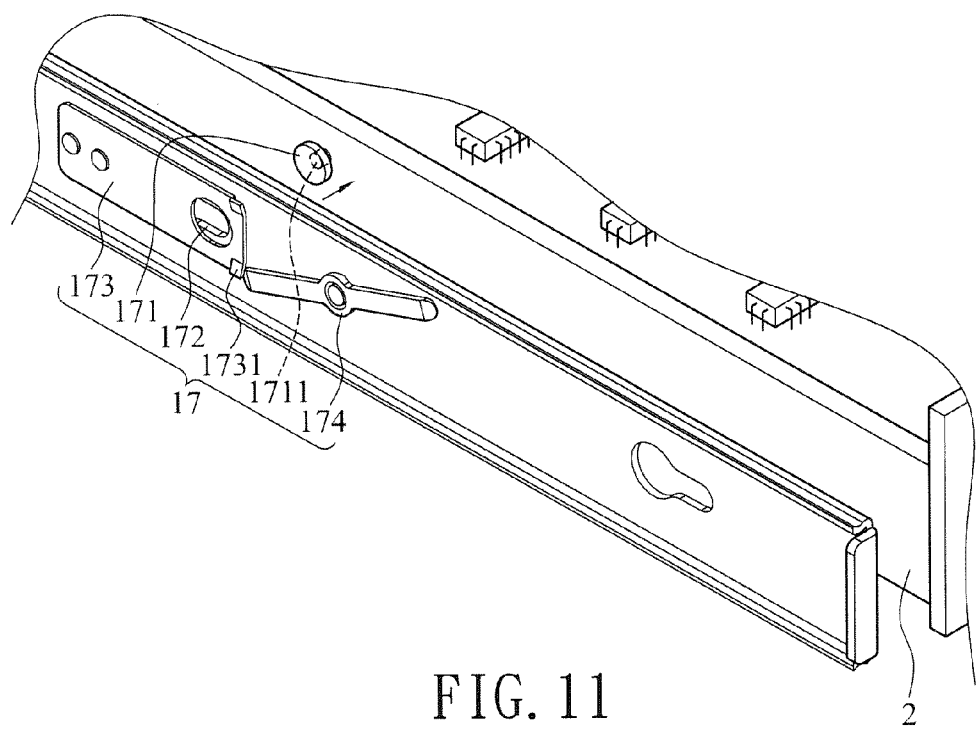
FIG. 11 is a second schematic view of the status of combining an inner rail with an industrial chassis of a preferred embodiment of the present invention.

With reference to FIGS. 10 and 11 for schematic views of the status of combining an inner rail with an industrial chassis of a preferred embodiment of the present invention, the thin server rack rail 1 further comprises a locking structure 17, and the locking structure 17 comprises a locking element 171, a locking hole 172, a locking plate 173 and a handle 174. The locking element 172 is secured to a surface of the industrial chassis 2, and the locking hole 172 is formed at a position of the inner rail 15 corresponsive to the locking element 171, and the locking plate 173 is installed on a surface of the inner rail 15 on a side of the locking hole 172, and the handle 174 is pivotally coupled to a side of the locking plate 173, and the locking hole 172 is an 8-shaped latch hole corresponsive to the locking element for latching a tapered portion 1711 of the locking element 171, and two corners on a side of the locking plate 173 have a pair of guide plates 1731 corresponsive to the handle 174 respectively. After the handle 174 is rotated, and the front end of the handle 174 is guided by the guide plate 1731 to pass and insert between the locking plate 173 and the inner rail 15, so that the locking element 171 is latched into the locking plate 173 to define a locking status.

What is claimed is:

1. A thin server rack rail, installed on two outer sides of an industrial chassis, for combining into the server rack for use, and the thin server rack rail comprising:

an outer rail, having a pair of limit members installed at a position on a surface of a middle section of the outer rail, and symmetrically installed with an interval apart from each other to form a passage;

at least one first rolling ball board, movably installed in the outer rail, such that the first rolling ball board may perform a limit movement in the outer rail;

a middle rail, movably installed in the first rolling ball board, for performing a limit movement with respect to the outer rail, and having a swinging plate pivotally installed at a surface of an end of the middle rail, and the other end of the swinging plate having a first pillar configure to be corresponsive to the passage, and the middle rail having a bump disposed on a surface at the front of the middle rail;

at least one second rolling ball board, movably installed in the middle rail, such that the second rolling ball board may perform a limit movement in the middle rail;

an inner rail, movably installed in the second rolling ball board, and the inner rail having a containing space formed therein and corresponsive to the swinging plate, and the containing space being provide for guiding the position of the swinging plate, so that the inner rail may perform a limit movement with respect to the middle rail by using the second rolling ball board, and when the inner rail is moved outwardly, the middle rail is linked to move outwardly together with the inner rail, and after the swinging plate is latched by one of the limit members, the middle rail will not continue to move outwardly, and the inner rail includes a link rod assembly corresponsive to the bump, and the link rod assembly is selectively latched to the bump for connection and use and separated from the bump to remove the inner rail; and a fixing assembly, covered and installed on the exterior of the outer rail, and having a length greater than that of the outer rail, and both ends of the fixing assembly having a fixing base passed and fixed into two symmetrical installing holes of the server rack separately.

2. The thin server rack rail of claim 1, wherein the swinging plate is substantially a triangular plate structure, and the first pillar is installed at an end of the swinging plate, and the other side of the swinging plate opposite to the first pillar has a pivoting portion, and a surface of the middle rail corresponsive to the first pillar has a limit slot, so that the first pillar may be movably installed in the limit slot.

3. The thin server rack rail of claim 2, wherein the link rod assembly comprises a first link rod and a second link rod, and the first link rod is parallel to the inner rail and movably installed into a surface of the inner rail, and the second link rod is pivotally coupled to a surface of the inner rail, and an end of the first link rod has a first notch, and an end of the second link rod includes a second pillar corresponsive to the first notch, so that the second pillar is received in the first notch, and the other end of the second link rod includes a second notch for latching the bump.

4. The thin server rack rail of claim 3, wherein, the fixing assembly is formed by engaging a first casing with a second casing integrally, and the first casing and the second casing may slide with respect to each other to extend or shorten the length.

5. The thin server rack rail of claim 4, wherein the fixing base includes a bump formed at the front of the fixing base and having a shape corresponsive to the installing hole, and the bump includes a latch member movably installed therein, and the latch member is protruded downwardly from a surface of the bump by gravity and latched into the installing hole.

6. The thin server rack rail of claim 5, wherein the latch member includes a bevel corresponsive to a plugging direction.

7. The thin server rack rail of claim 6, further comprising a locking structure, and the locking structure comprising a locking element, a locking hole, a locking plate and a handle, and the locking element being disposed on a surface of the industrial chassis, and the locking hole being formed at a position of the inner rail and corresponsive to the locking element, and the locking plate being installed on a surface of the inner rail on a side of the locking hole, and the handle being pivotally coupled to a side of the locking plate, and the handle being rotated and then plugged between the locking plate and the inner rail, such that the locking element is latched into the locking plate to define a locking status.

8. The thin server rack rail of claim 7, wherein the locking hole is configured to be corresponsive to the locking element to form an 8-shaped latch hole provided for being latched by a tapered portion of the locking element, and the locking plate includes at least one guide plate warped with respect to the handle and provided for inserting the handle between the locking plate and the inner rail.

* * * * *